US012588519B2

(12) United States Patent
Miyake et al.

(10) Patent No.: US 12,588,519 B2
(45) Date of Patent: Mar. 24, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Eitaro Miyake, Kawasaki Kanagawa (JP); Fumiyoshi Kawashiro, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 270 days.

(21) Appl. No.: 18/117,541

(22) Filed: Mar. 6, 2023

(65) Prior Publication Data

US 2024/0105558 A1 Mar. 28, 2024

(30) Foreign Application Priority Data

Sep. 22, 2022 (JP) ................................. 2022-151644

(51) Int. Cl.
*H01L 23/495* (2006.01)
*H01L 21/48* (2006.01)
(Continued)

(52) U.S. Cl.
CPC ...... *H01L 23/4951* (2013.01); *H01L 21/4846* (2013.01); *H01L 21/56* (2013.01);
(Continued)

(58) Field of Classification Search
CPC ............. H01L 23/4951; H01L 23/3107; H01L 29/66333; H01L 29/66666;
(Continued)

(56) References Cited

U.S. PATENT DOCUMENTS 6,569,764 B1 * 5/2003 Hirashima ........ H01L 23/49562
257/E23.044
8,653,643 B2 2/2014 Orimoto
(Continued)

FOREIGN PATENT DOCUMENTS

JP 5637156 B2 12/2014
JP 5892250 B2 3/2016
JP 6967627 B2 11/2021

OTHER PUBLICATIONS

IQE006NE2LM5 Data sheet, Infineon Technologies, URL: https://www/infineon.com/dgdl/Infineon-IQE006NE2LM5-DataSheet-v0201-EN.pdf?filed=5546d4626f229553016f8b08cb821aa4, 2020.
(Continued)

*Primary Examiner* — Dale E Page
*Assistant Examiner* — Douglas Yap
(74) *Attorney, Agent, or Firm* — Kim & Stewart LLP

(57) ABSTRACT

According to one embodiment, there is provided a semiconductor device including a chip, and a gate electrode connected to a gate electrode pad provided on the chip. The gate electrode includes an external exposed portion having an external exposed surface that is flush with an external exposed surface of a sealing resin, and a gate electrode pad connection portion continuous with the external exposed portion and connected to the gate electrode pad, the gate electrode pad connection portion including a portion sandwiched between the gate electrode pad and a part of the sealing resin.

15 Claims, 8 Drawing Sheets

(51) Int. Cl.
　　*H01L 21/56* (2006.01)
　　*H01L 23/31* (2006.01)
(52) U.S. Cl.
　　CPC .... *H01L 23/3107* (2013.01); *H01L 23/49562* (2013.01); *H01L 2224/06* (2013.01); *H01L 2224/061* (2013.01)
(58) Field of Classification Search
　　CPC ....... H01L 29/66712–66734; H01L 29/66909; H01L 29/7395–7398; H01L 29/778; H01L 29/7802–7815; H01L 29/7827–7828; H01L 29/8083; H01L 29/8122; H01L 29/42372; H01L 29/42376; H01L 29/4238; H01L 29/41741; H01L 29/42316; H01L 29/4232; H01L 29/4846; H01L 29/49551–49555; H10D 12/032; H10D 12/441; H10D 30/025; H10D 30/0515; H10D 30/47; H10D 30/66; H10D 30/63; H10D 30/635; H10D 30/831; H10D 30/871; H10D 64/252; H10D 64/2523; H10D 64/2527; H10D 64/411; H10D 64/511; H10D 64/517; H10D 64/519; H10D 64/518
　　See application file for complete search history.

(56) References Cited

U.S. PATENT DOCUMENTS

| | | | |
|---|---|---|---|
| 9,402,311 | B2 | 7/2016 | Sunaga et al. |
| 2004/0169289 | A1* | 9/2004 | Satou ...................... H01L 24/41 257/E23.044 |
| 2006/0177967 | A1* | 8/2006 | Muto ............... H01L 23/49537 257/E23.044 |
| 2006/0202320 | A1 | 9/2006 | Schaffer |
| 2011/0309487 | A1 | 12/2011 | Satou et al. |
| 2015/0194373 | A1* | 7/2015 | Otremba ................. H01L 24/17 257/676 |
| 2018/0122766 | A1* | 5/2018 | Okunishi ............ H01L 23/3114 |
| 2020/0273790 | A1* | 8/2020 | Tay ................... H01L 23/49861 |
| 2022/0238421 | A1* | 7/2022 | Quinones ............ H01L 23/4824 |
| 2023/0386981 | A1* | 11/2023 | Ohmori ............ H01L 23/49541 |

OTHER PUBLICATIONS

OptiMOS Source-Down power MOSFET 25-150 V: An innovative PQFN 3.3×3.3 mm product family, Infineon Technologies, 2020.

* cited by examiner

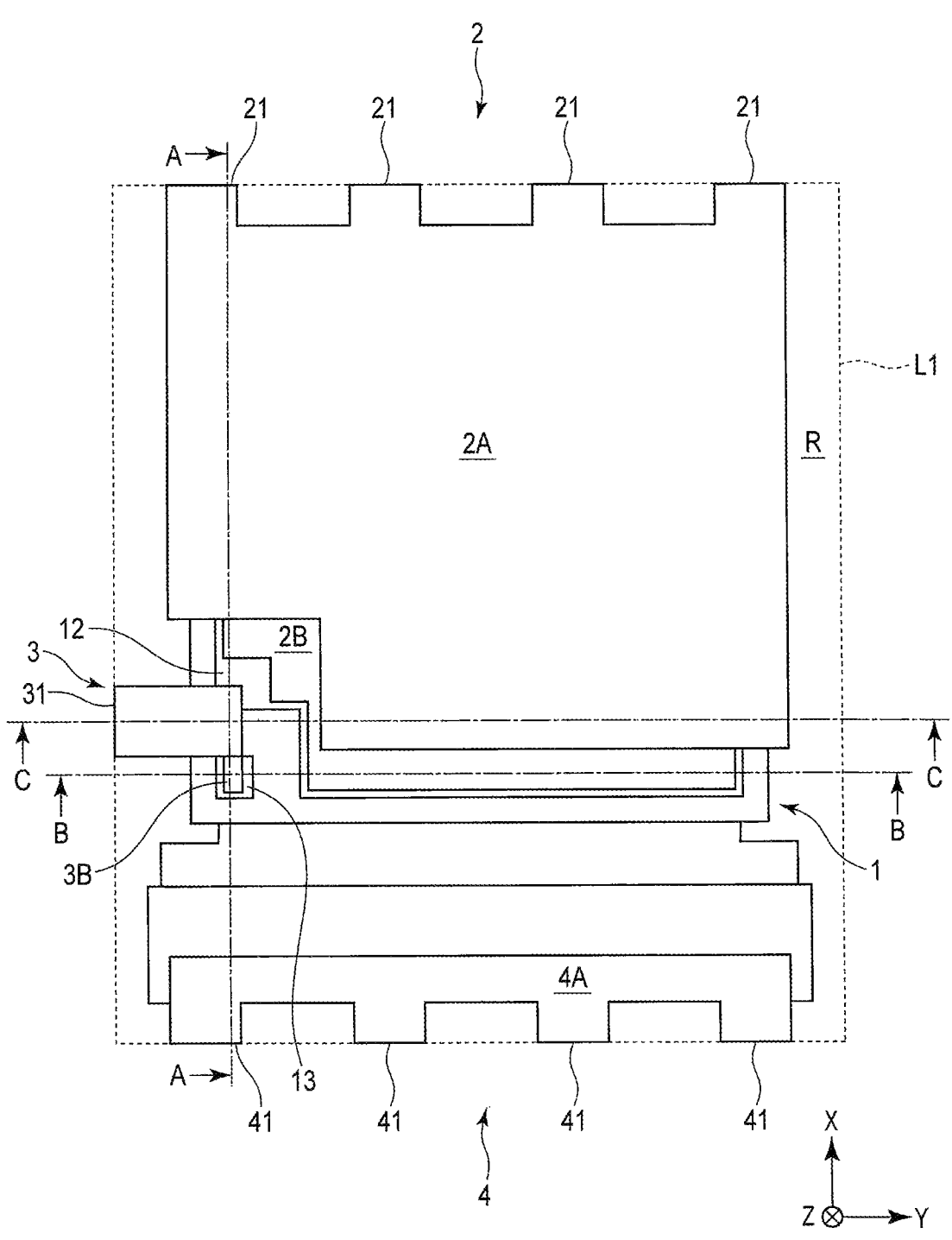
F I G. 2

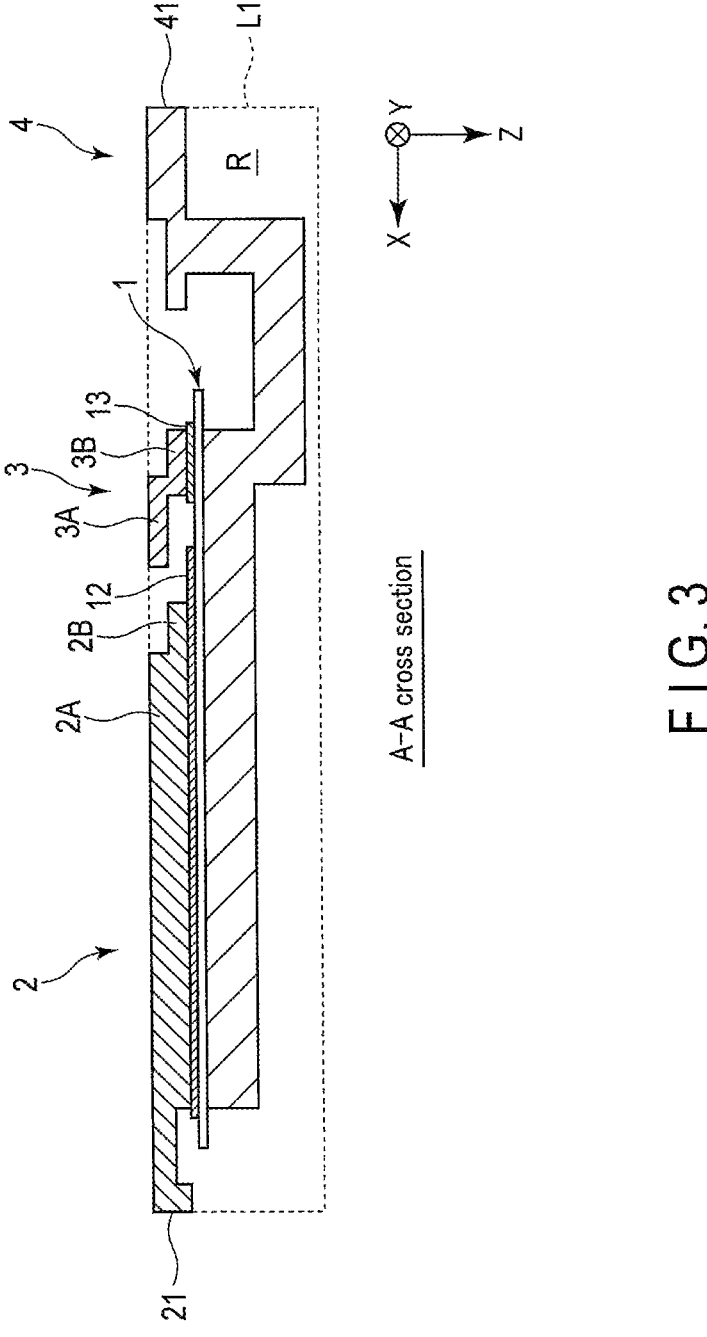
A-A cross section
F I G. 3

B-B cross section

C-C cross section

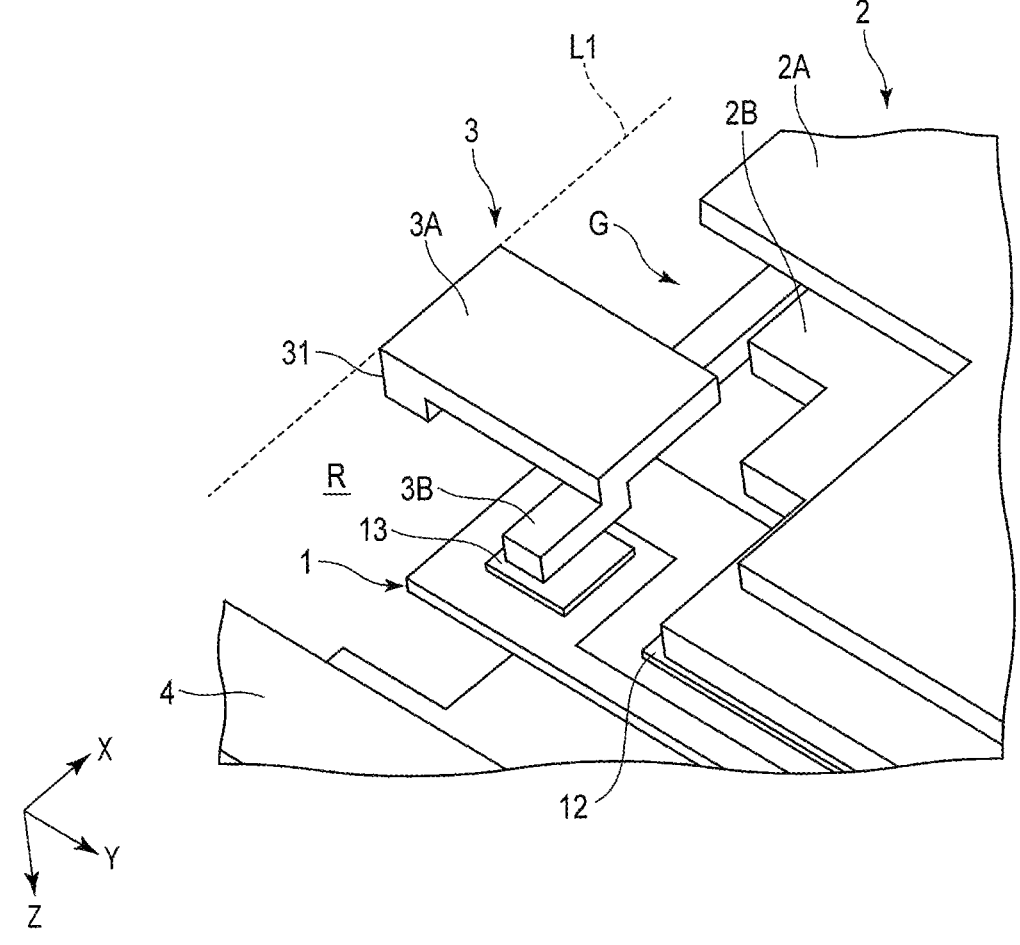
F I G. 6

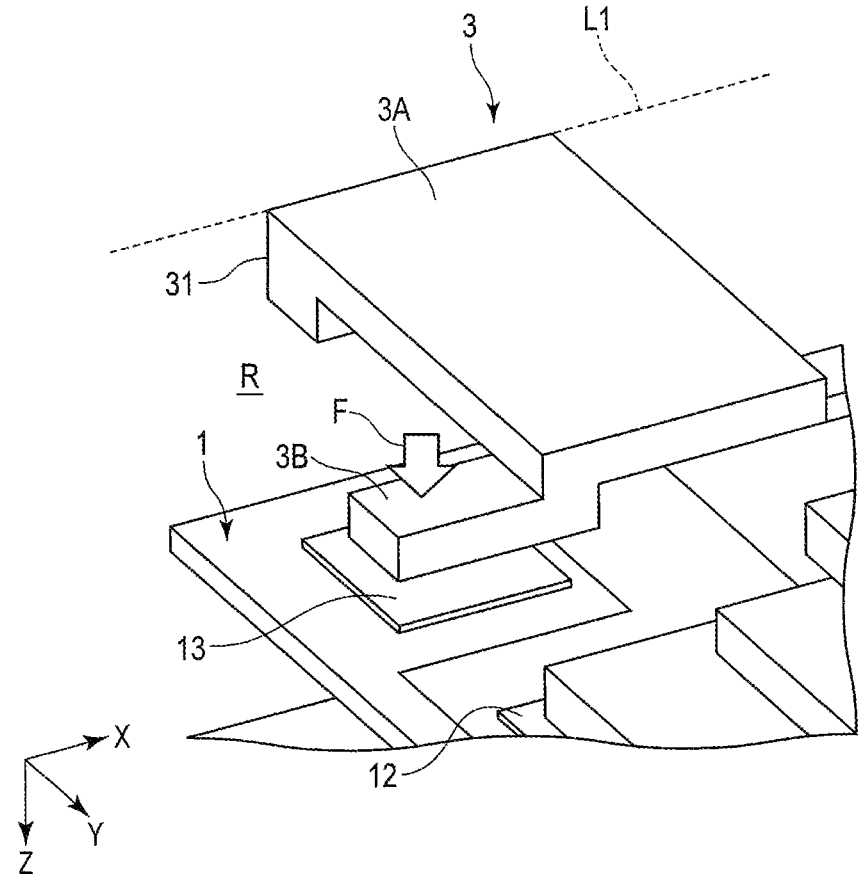
F I G. 7

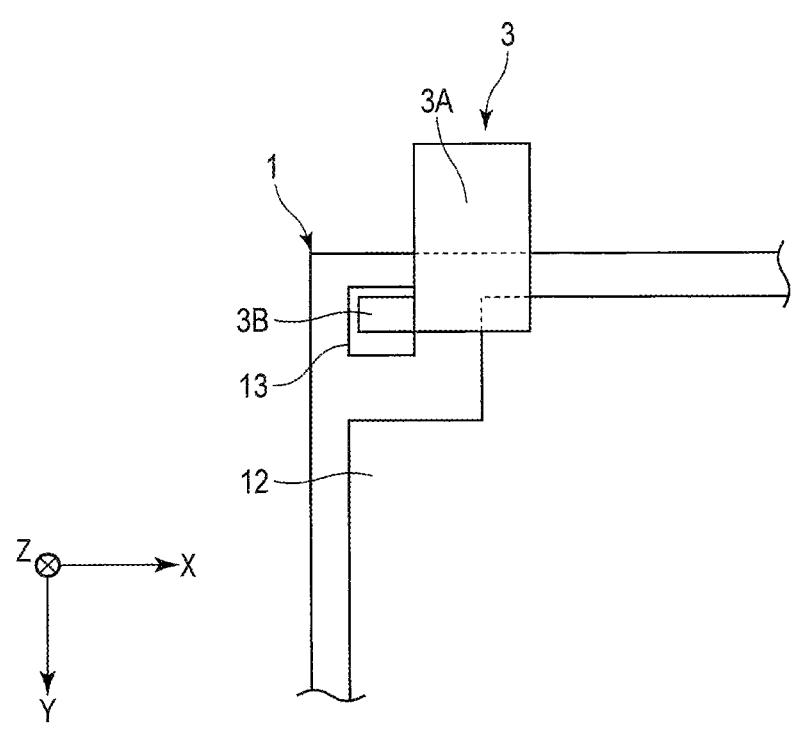
F I G. 8A
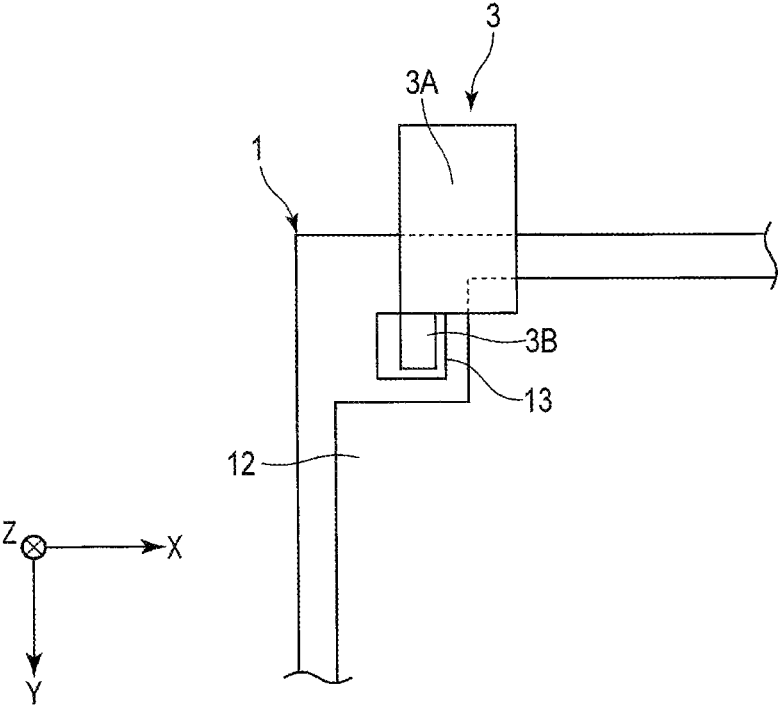
F I G. 8B

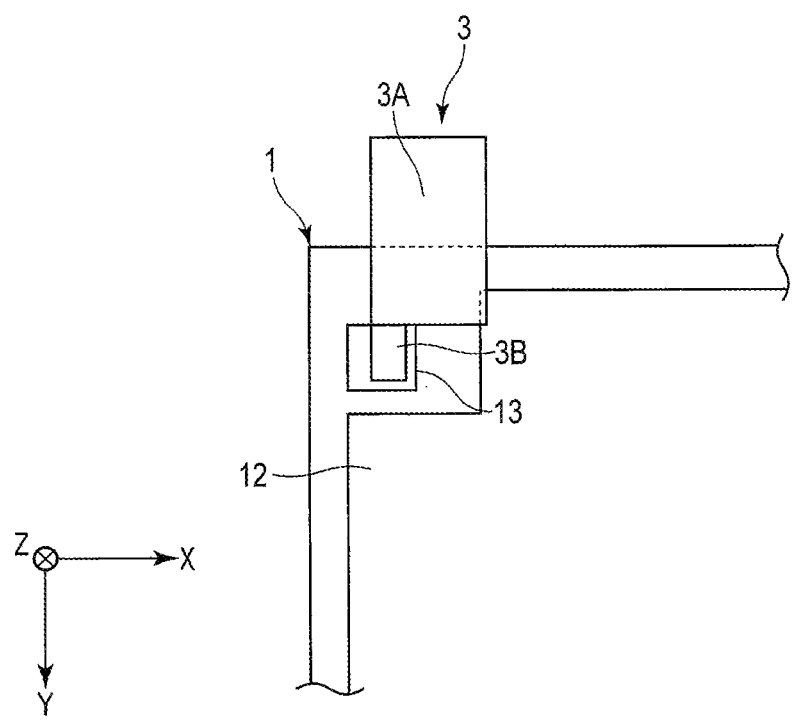
F I G. 8C

SEMICONDUCTOR DEVICE

CROSS-REFERENCE TO RELATED APPLICATION

This application is based upon and claims the benefit of priority from Japanese Patent Application No. 2022-151644, filed Sep. 22, 2022, the entire contents of which are incorporated herein by reference.

FIELD

Embodiments described herein relate generally to a semiconductor device.

BACKGROUND

A chip and various electrodes are mounted on a semiconductor device. On the chip, regions where the various electrodes are connected are provided.

It is desirable for the above chip to have a large active area.

BRIEF DESCRIPTION OF THE DRAWINGS

FIG. 2 is a plan view showing an example of a structure of the semiconductor device shown in FIG. 1 as viewed in a Z direction.

FIG. 3 is a cross-sectional view showing a cross-sectional shape of an A-A cross-sectional portion shown in FIG. 2.

FIG. 6 is an enlarged view showing a periphery of a gate electrode 3 shown in FIG. 1.

FIG. 7 is a conceptual diagram showing a force F from a sealing resin R being applied to a gate electrode pad connection portion 3B of the gate electrode 3.

FIG. 8A is a conceptual diagram showing a first arrangement example of the gate electrode 3.

FIG. 8B is a conceptual diagram showing a second arrangement example of the gate electrode 3.

FIG. 8C is a conceptual diagram showing a third arrangement example of the gate electrode 3.

DETAILED DESCRIPTION

Embodiments will be described below with reference to the drawings. In general, according to one embodiment, there is provided a semiconductor device including a chip, and a gate electrode connected to a gate electrode pad provided on the chip. The gate electrode includes an external exposed portion having an external exposed surface that is flush with an external exposed surface of a sealing resin, and a gate electrode pad connection portion continuous with the external exposed portion and connected to the gate electrode pad, the gate electrode pad connection portion including a portion sandwiched between the gate electrode pad and a part of the sealing resin.

(Configuration of Semiconductor Device)

A configuration of a semiconductor device according to a present embodiment will be described with reference to FIGS. 1 to 5.

Figure 1:
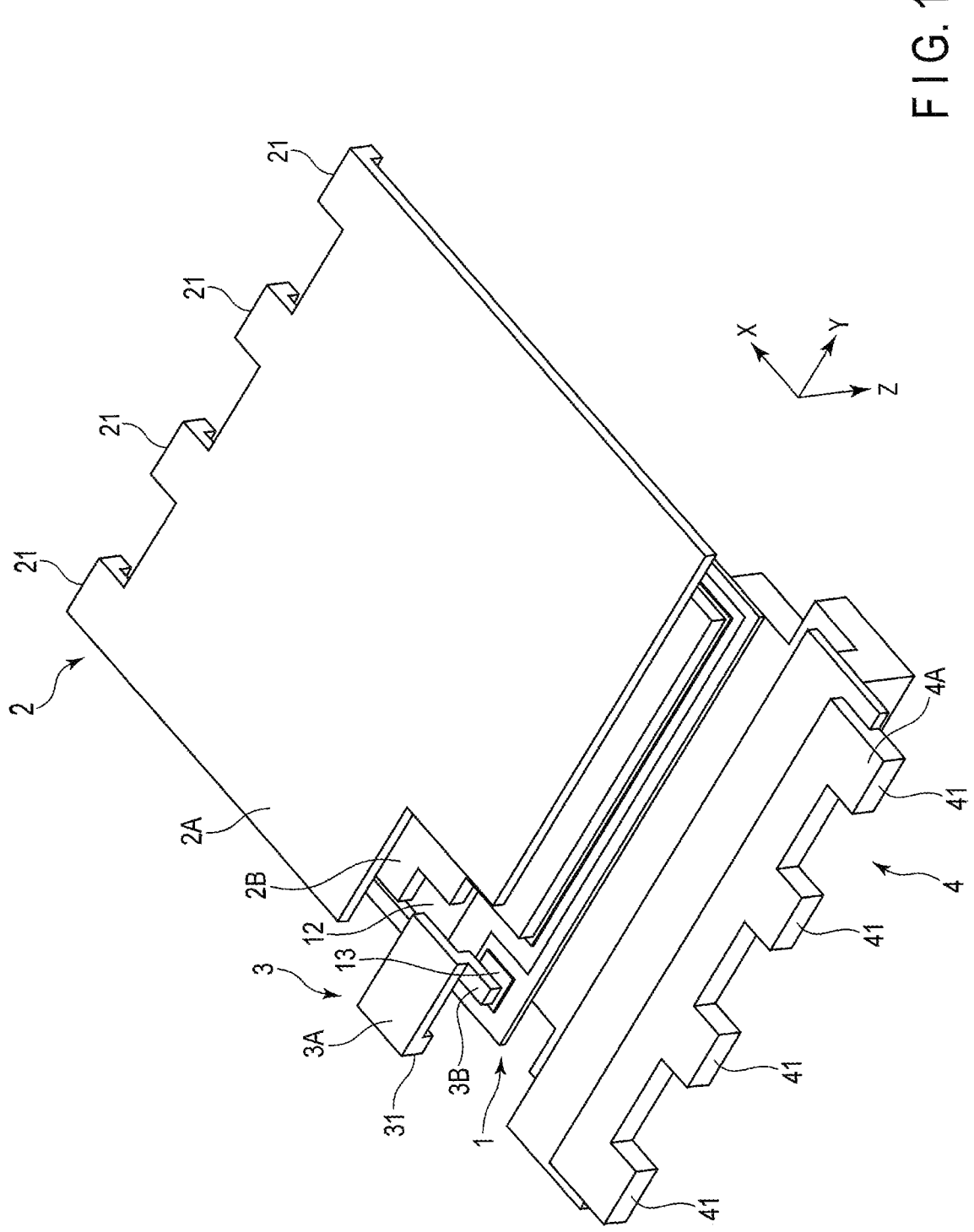
FIG. 1 is a perspective view showing an example of a structure of a part of a semiconductor device according to an embodiment.

FIG. 1 is a perspective view showing an example of a structure of a part of the semiconductor device according to the present embodiment. X, Y, and Z in FIG. 1 indicate a positional relationship of the semiconductor device in a three-dimensional space, and will also be used in each drawing to be described later. The structure shown in FIG. 1 is merely an example, and the structure is not limited to this example. Arrangement relationships, shapes, sizes, etc. of the components may be changed as appropriate.

The semiconductor device exemplified in the present embodiment is a semiconductor device sealed in a package of a source-down structure in which a source electrode is provided on a bottom surface of the package. FIG. 1 shows a state in which the source electrode faces upward (i.e., a state in which the semiconductor device is turned upside down) to facilitate visualization of a main part.

Although not shown in FIG. 1, the semiconductor device according to the present embodiment includes not only the various elements shown in FIG. 1 but also a resin (sealing resin) to be described later, and is sealed as a single package.

As shown in FIG. 1, the semiconductor device includes a chip 1, a source electrode (first electrode) 2, a gate electrode 3, a drain electrode (second electrode) 4, etc.

The chip 1 is formed by, for example, an integrated circuit (IC), and includes, for example, a field effect transistor (FET) such as a MOSFET. Each of the source electrode 2, the gate electrode 3, and the drain electrode 4 is formed of an electrically conductive material, e.g., a metallic material such as a copper.

The chip 1 has a region for connecting the source electrode 2 and a region for connecting the gate electrode 3 on a first surface, and a region for connecting the drain electrode 4 on a second surface (not shown in FIG. 1) provided on a back side of the first surface. In the region for connecting the source electrode 2, a source electrode pad (a first electrode pad) 12 is provided. In the region for connecting the gate electrode 3, a gate electrode pad (a second electrode pad) 13 is provided. The region with the source electrode pad 12 and the region with the gate electrode pad 13 are physically and electrically separated by a polyimide layer.

The source electrode 2 includes a source electrode external exposed portion 2A and a source electrode pad connection portion 2B. The source electrode external exposed portion 2A includes a source electrode terminal 21. The source electrode 2 has, for example, a plate-like shape, and has the source pad connection portion 2B connected to the chip via solder on a front surface and the source electrode external exposed portion 2A on a side of a back surface, which is a surface opposite to the front surface.

The source electrode external exposed portion 2A is a portion having a surface (an external exposed surface) to be exposed outside after resin sealing. The source electrode pad connection portion 2B is a portion formed integrally with the source electrode external exposed portion 2A and having a surface to be connected to the source electrode pad 12. The source electrode terminal 21 is a part of the source electrode external exposed portion 2A, and corresponds to a lead terminal (or a lead pin) for electrical connection with an external entity. When viewed from a bottom surface side of the semiconductor device (or from below a side of the second surface (back surface) of the chip 1), the source electrode external exposed portion 2A has a region that overlaps with the second surface of the chip 1. In other words, in a Z-axis direction, the source electrode external exposed portion 2A has a region that overlaps with the second surface of the chip 1.

The gate electrode 3 includes a gate electrode external exposed portion 3A and a gate electrode pad connection portion 3B. The gate electrode external exposed portion 3A includes a gate electrode terminal 31. The gate electrode external exposed portion 3A is a portion having a surface (an external exposed surface) to be exposed outside after resin sealing. The gate electrode pad connection portion 3B is a portion formed integrally with the gate electrode external exposed portion 3A and to be connected with the gate electrode pad 13. The gate electrode terminal 31 is a part of the gate electrode external exposed portion 3A, and corresponds to a lead terminal (or a lead pin) for electrical connection with an external entity.

The drain electrode 4 includes a drain electrode external exposed portion 4A. The drain electrode external exposed portion 4A includes a drain electrode terminal 41. The drain electrode external exposed portion 4A is a portion having a surface (an external exposed surface) to be exposed outside after resin sealing. The drain electrode terminal 41 is a part of the drain electrode external exposed portion 4A, and corresponds to a lead terminal (or a lead pin) for electrical connection with an external entity. The drain electrode 4 is, for example, formed of an electrical conductive member and has a shape of a metal plate that is processed and bent, and the drain electrode terminal 41 of the drain electrode 4 is provided on the aforementioned first surface side and a side surface side of the chip 1 (i.e., in a space that is present in a direction opposite to the Z direction with respect to the first surface of the chip 1 and that is present further in a direction opposite to the X direction than the side surface of the chip 1 on a side opposite to the X direction).

The gate electrode 3 and the source electrode 2 are formed using the same frame member, and the gate electrode 3 is separated from the source electrode 2 by removing a part of the member by cutting or etching. This ensures that the gate electrode 3 is arranged at a certain distance from the source electrode 2 and that the region where the gate electrode pad 13 is arranged on the chip 1 is at a certain distance from the region where the source electrode pad 12 is arranged on the chip 1. A structure possessed by the gate electrode pad connection portion 3B to be described later enables the gate electrode pad 13 to be arranged in, for example, a small region at an end on the chip 1, reducing the region where the gate electrode pad 13 is arranged, and simultaneously expanding the region where the source electrode pad 12 is arranged.

(Range of Sealing Resin)

FIG. 2 is a plan view showing an example of a structure of the semiconductor device shown in FIG. 1 as viewed in the Z direction. The structure shown in FIG. 2 is merely an example, and the structure is not limited to this example. Arrangement relationships, shapes, sizes, etc. of the components may be changed as appropriate.

In the plan view of FIG. 2, an A-A cross-sectional portion, a B-B cross-sectional portion, and a C-C cross-sectional portion indicating cross-sectional portions of main parts are illustrated by dashed-dotted lines.

FIG. 3 is a cross-sectional view showing a cross-sectional shape of the A-A cross-sectional portion shown in FIG. 2.

A sealing resin R is sealed to fit within a range of a broken line L1 as shown in FIGS. 2 and 3. The sealing resin R is, for example, an epoxy resin. Portions to be exposed from the package after resin sealing are the external exposed surface of the source electrode external exposed portion 2A (including an external exposed surface of the source electrode terminal 21), the external exposed surface of the gate electrode external exposed portion 3A (including an external exposed surface of the gate electrode terminal 31), and the external exposed surface of the drain electrode external exposed portion 4A (including an external exposed surface of the drain electrode terminal 41).

FIGS. 2 and 3 show an example of a case in which the external exposed surface of each of the source electrode terminal 21, the gate electrode terminal 31, and the drain electrode terminal 41 is flush with a front surface of the sealing resin R adjacent thereto. In this example, the package forms a cuboid without protrusions and thus is easy to handle. However, the structure is not limited to this example, and the source electrode terminal 21, the gate electrode terminal 31, and the drain electrode terminal 41 may have a structure protruding outside the front surface of the adjacent sealing resin R by a predetermined distance. Depending on the form of a connection destination, the protruding structure may be preferred.

(Cross-Sectional Shape of Semiconductor Device)

Figure 4:
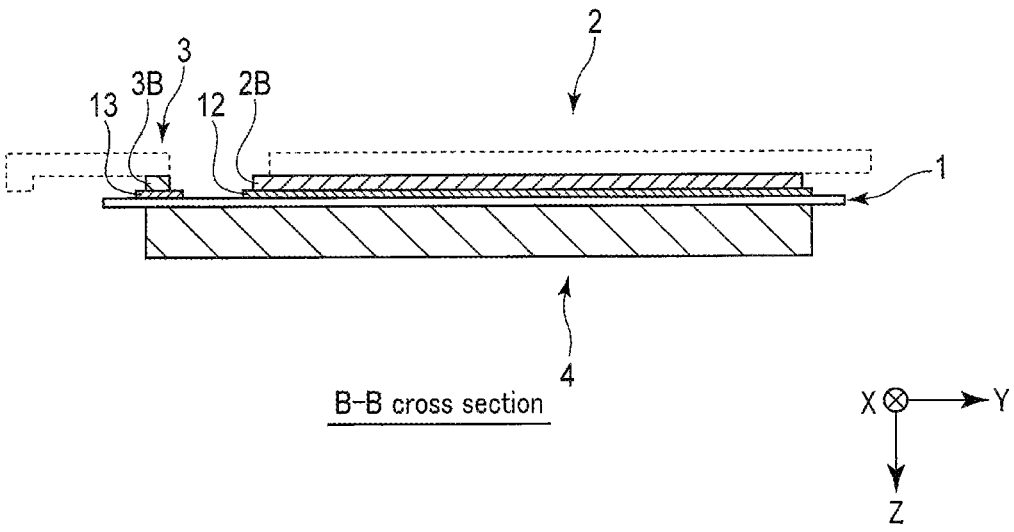
FIG. 4 is a cross-sectional view showing a cross-sectional shape of a B-B cross-sectional portion shown in FIG. 2.
Figure 5:
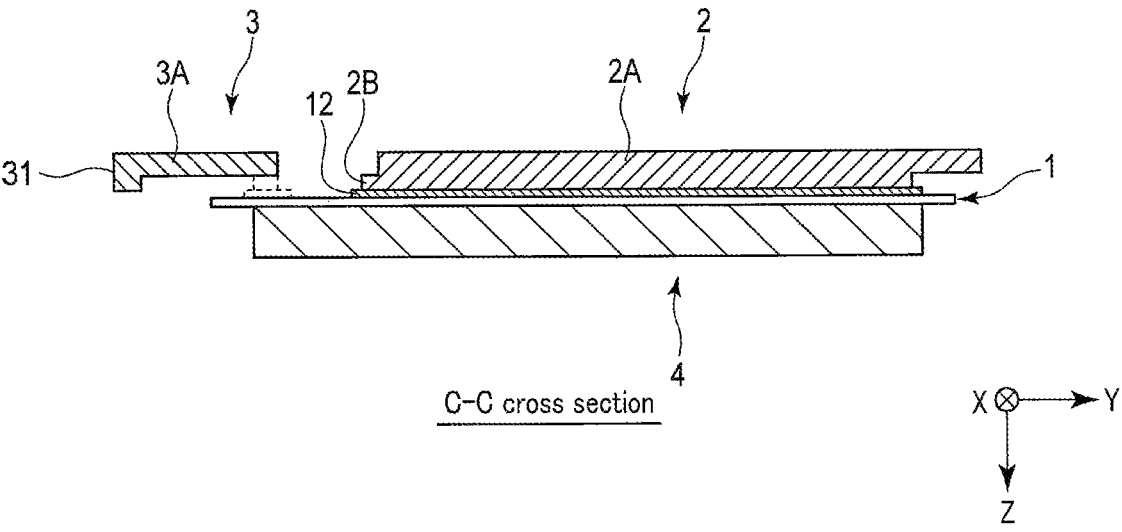
FIG. 5 is a cross-sectional view showing a cross-sectional shape of a C-C cross-sectional portion shown in FIG. 2.

FIG. 4 is a cross-sectional view showing a cross-sectional shape of the B-B cross-sectional portion shown in FIG. 2. FIG. 5 is a cross-sectional view showing a cross-sectional shape of the C-C cross-sectional portion shown in FIG. 2. A broken line in each of FIGS. 4 and 5 represents, for reference, a shape of a relevant portion existing in a depth direction or a front side direction of a structure shown on the cross section.

As can be seen from FIGS. 3 to 5, the gate electrode terminal 31 of the gate electrode 3 is electrically connected to the gate electrode pad 13 on the chip 1 via the gate electrode external exposed portion 3A and the gate electrode pad connection portion 3B, and the source electrode terminal 21 of the source electrode 2 is electrically connected to the source electrode pad 12 on the chip 1 via the source electrode external exposed portion 2A and the source electrode pad connection portion 2B. There is a certain distance or more between the gate electrode pad 13 and the source electrode pad 12. Further, the drain electrode terminal 41 of the drain electrode 4 is wrapped around the aforementioned second surface side from the drain electrode external exposed portion 4A and electrically connected to a predetermined region on the chip 1.

(Details of Gate Electrode 3)

FIG. 6 is an enlarged view showing an enlarged periphery of the gate electrode 3 shown in FIG. 1. FIG. 7 is a conceptual diagram showing a force F from the sealing resin R being applied to the gate electrode pad connection portion 3B of the gate electrode 3.

As shown in FIG. 5, the gate electrode external exposed portion 3A of the gate electrode 3 has the external exposed surface that is flush with the external exposed surface of the sealing resin R. Further, the source electrode external exposed portion 2A of the source electrode 2 also has the external exposed surface that is flush with the external exposed surface of the sealing resin R. That is, the external exposed surface of the gate electrode external exposed portion 3A, the external exposed surface of the sealing resin R, and the external exposed surface of the source electrode external exposed portion 2A form one plane.

In addition, the thickness of the gate electrode external exposed portion 3A may be made thin near the center of the gate electrode external exposed portion 3A and an external exposed area on the gate electrode terminal 31 side may be formed large to ensure a certain level or more of electrical connectivity with an external connection destination while preventing short circuits with other portions.

The gate electrode pad connection portion 3B is provided on a back side of the gate electrode external exposed portion

5

3A. The gate electrode pad connection portion 3B is continuous with the gate electrode external exposed portion 3A, and is formed of the same member as and integrally with the gate electrode external exposed portion 3A. This gate electrode pad connection portion 3B has a structure protruding from the gate electrode external exposed portion 3A toward one direction parallel to the external exposed surface of the gate electrode external exposed portion 3A, and a back side surface of the gate electrode pad connection portion 3B is bonded to the gate electrode pad 13 with solder, etc. In the descriptions below, the gate electrode pad connection portion 3B will be referred to as a protrusion 3B.

The protrusion 3B is arranged to be sandwiched between the gate electrode pad 13 and a part of the sealing resin R. Specifically, a height of a surface of the protrusion 3B in contact with a part of the sealing resin R described above is at a certain distance or more (i.e., there is a level difference) from a height of the external exposed surface of the gate electrode external exposed portion 3A, so that the sealing resin R is introduced over a surface (hereinafter, referred to as a "back surface of the protrusion 3B") on a side opposite to the surface to be bonded to the gate electrode pad 13. To allow more sealing resin R to be introduced here, the thickness of the protrusion 3B may be formed thinner than that of the original frame member.

A size of the bonding surface of the protrusion 3B to be bonded to the gate electrode pad 13 is formed according to a size of the gate electrode pad 13, and may be slightly smaller or larger than the size of the gate electrode pad 13. For example, the protrusion 3B may have a portion overhanging horizontally from the gate electrode pad 13 to some extent on the bonding surface with the gate electrode pad 13. However, short circuits with other portions should not occur. Especially, the overhang direction should not be oriented in a direction toward an end portion (edge) of the chip 1. This is because the closer to the end portion of the chip 1, the higher the potential, which may cause a leakage current.

As shown in FIG. 7, the protrusion 3B is pushed by the sealing resin R that has been introduced over the back surface of the protrusion 3B, with the force F being applied toward the gate electrode pad 13 side. As a result, even if the gate electrode pad 13 is small, a certain level or more of bonding strength with the gate electrode pad 13 can be obtained, and bonding interface delamination caused by material hardening and shrinkage, etc., is also suppressed. In addition, a length of the protrusion 3B in the X direction is, for example, shorter than that of the gate electrode external exposed portion 3A in the X direction, and a length of the protrusion 3B in the Y direction is shorter than that of the gate electrode external exposed portion 3A in the Y direction. In other words, an area of the protrusion 3B is smaller than that of the gate electrode external exposed portion 3A. This makes it easier to secure the region of the gate electrode external exposed portion 3A while keeping the region of the gate electrode pad 13 on the chip 1 small. By keeping the region of the gate electrode pad 13 small, the region on the chip 1 other than this region can be increased, thus ensuring a large active area. The protrusion 3B extends in the directions the surface of the gate electrode pad 13 expands (the X direction and the Y direction), and lengths in the extending directions are longer than a length of the protrusion 3B in the Z-axis direction. This allows a large area to receive the force F, which facilitates transmission of the force F to the protrusion 3B.

(Variations in Arrangement of Gate Electrode 3)

The arrangement of the gate electrode 3 is not limited to the example shown in FIGS. 1 to 7, and may be changed as appropriate. Now, variations in the arrangement of the gate electrode 3 will be described with reference to FIGS. 8A, 8B, and 8C.

FIGS. 8A, 8B, and 8C are conceptual diagrams showing a first arrangement example, a second arrangement example, and a third arrangement example of the gate electrode 3, respectively.

The first arrangement example shown in FIG. 8A is an arrangement example of a case in which the protrusion 3B protrudes from the gate electrode external exposed portion 3A in a direction opposite to the X direction, in the same manner as in FIGS. 1 to 7. In this arrangement example, a small region of the gate electrode pad 13 can be provided in a corner of the chip 1, so the region (the active area in which the source electrode pad 12, etc. are arranged) on the chip 1 other than this region can be efficiently increased.

The second arrangement example shown in FIG. 8B is an arrangement example of a case in which the protrusion 3B protrudes from the gate electrode external exposed portion 3A in the Y direction. This arrangement example can also accommodate cases where the gate electrode pad 13 is arranged a short distance away from the corner of the chip 1.

The third arrangement example shown in FIG. 8C is an arrangement example of a case in which positions of the gate electrode pad 13 and the gate electrode 3 with respect to the chip 1 are both shifted in the direction opposite to the X direction as compared with the second arrangement example. This arrangement example is effective in a case where a relative position of the gate electrode 3 with respect to the chip 1 can be changed.

According to the embodiments, the region of the gate electrode pad 13 on the chip 1 can be made small and the region on the chip 1 other than this region can be made large, thus ensuring a large active area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

What is claimed is:

1. A semiconductor device comprising:
a chip having a source electrode pad and a gate electrode pad on a surface of the chip;
a source electrode on the source electrode pad, the source electrode having first and second surfaces that are respectively on opposite sides of the source electrode, the first surface being connected to the source electrode pad, the second surface including an exposed surface that overlaps the chip in a first direction perpendicular to the surface of the chip; and
a gate electrode connected to the gate electrode pad provided on the chip, the gate electrode including:
an external exposed portion having an external exposed surface that is flush with an external exposed surface of a sealing resin, and
a connection portion connected to the external exposed portion and connected to the gate electrode pad, the connection portion including a portion sandwiched between the gate electrode pad and a part of the sealing resin,

wherein the external exposed portion extends away from the connection portion in a second direction perpendicular to the first direction and has a first length in the second direction and a second length in a third direction perpendicular to the first and second directions, wherein the connection portion extends away from the external exposed portion in the third direction and has a third length in the third direction and a fourth length in the second direction, wherein the first length is longer than the third length and the fourth length, and wherein the second length is longer than the third length and the fourth length.

2. The semiconductor device according to claim 1, wherein the connection portion has a structure protruding from the external exposed portion in the third direction.

3. The semiconductor device according to claim 1, wherein the connection portion has a surface in contact with the part of the sealing resin at a height that is a certain distance or more from a height of the external exposed surface of the external exposed portion.

4. The semiconductor device according to claim 1, wherein the connection portion is formed of the same member as and integrally with the external exposed portion.

5. The semiconductor device according to claim 1, wherein the second surface of the source electrode is flush with the external exposed surface of the sealing resin.

6. The semiconductor device according to claim 5, wherein the chip has a region for connecting a drain electrode on a back side surface of the surface of the chip.

7. A semiconductor device comprising:

a chip having a source electrode pad and a gate electrode pad on a surface of the chip;

a source electrode on the source electrode pad, the source electrode having first and second surfaces that are respectively on opposite sides of the source electrode, the first surface being connected to the source electrode pad, the second surface including an exposed surface that overlaps the chip in a first direction perpendicular to the surface of the chip;

a drain electrode provided on a second surface side of the chip and having a drain electrode terminal on a first surface side of the chip; and a gate electrode connected to the gate electrode pad provided on the chip, the gate electrode including:

an external exposed portion having an external exposed surface that is flush with an external exposed surface of a sealing resin, and a connection portion connected to the external exposed portion and connected to the gate electrode pad, the connection portion being located between the gate electrode pad and the sealing resin, wherein the external exposed portion extends away from the connection portion in a second direction perpendicular to the first direction and has a first length in the second direction and a second length in a third direction perpendicular to the first and second directions, wherein the connection portion extends away from the external exposed portion in the third direction and has a third length in the third direction and a fourth length in the second direction, wherein the first length is longer than the third length and the fourth length, and wherein the second length is longer than the third length and the fourth length.

8. The semiconductor device according to claim 7, wherein the connection portion has a structure protruding from the external exposed portion in the third direction.

9. The semiconductor device according to claim 7, wherein the connection portion is formed of the same member as and integrally with the external exposed portion.

10. The semiconductor device according to claim 1, wherein the semiconductor device is a semiconductor device sealed in a package of a source-down structure in which the source electrode is provided on a bottom surface of the package.

11. The semiconductor device according to claim 1, wherein the source electrode has terminals arranged in the third direction along the second surface, and the external exposed portion has a rectangular plate in which a length of the rectangular plate in the third direction is longer than a length of the rectangular plate in the second direction.

12. The semiconductor device according to claim 11, wherein a distance from an end of the chip to an end of the external exposed portion protruding in the second direction from the end of the chip is greater than a distance from the end of the chip to an end of the source electrode protruding in the second direction from the end of the chip.

13. The semiconductor device according to claim 7, wherein the source electrode has terminals arranged in the third direction along the second surface, and the external exposed portion has a rectangular plate in which a length of the rectangular plate in the third direction is longer than a length of the rectangular plate in the second direction.

14. The semiconductor device according to claim 13, wherein a distance from an end of the chip to an end of the external exposed portion protruding in the second direction from the end of the chip is greater than a distance from the end of the chip to an end of the source electrode protruding in the second direction from the end of the chip.

15. The semiconductor device according to claim 7, wherein the source electrode has terminals arranged in the third direction along the second surface, and the drain electrode has an exposed third surface, the external exposed portion being provided between the second surface and the third surface in the second direction.

* * * * *